(12) United States Patent
Loken et al.

(10) Patent No.: US 9,995,571 B1
(45) Date of Patent: Jun. 12, 2018

(54) METHOD AND APPARATUS TO DETERMINE SLIDER-LEVEL FLATNESS AS PROVIDED ON A FULL CARRIER

(71) Applicant: Seagate Technology LLC, Cupertino, CA (US)

(72) Inventors: Kurtis Dean Loken, Bloomington, MN (US); Andrew Habermas, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 10 days.

(21) Appl. No.: 15/212,874

(22) Filed: Jul. 18, 2016

Related U.S. Application Data

(60) Provisional application No. 62/193,438, filed on Jul. 16, 2015.

(51) Int. Cl.
  *G01B 11/24* (2006.01)
  *G01B 11/30* (2006.01)
  *H01L 21/78* (2006.01)

(52) U.S. Cl.
  CPC ........ *G01B 11/2441* (2013.01); *G01B 11/306* (2013.01); *H01L 21/78* (2013.01)

(58) Field of Classification Search
  None
  See application file for complete search history.

(56) References Cited

U.S. PATENT DOCUMENTS

| | | | | |
|---|---|---|---|---|
| 5,991,461 | A * | 11/1999 | Schmucker | G06T 11/00 345/419 |
| 6,449,048 | B1 * | 9/2002 | Olszak | G01B 11/2441 356/497 |
| 6,662,069 | B1 | 12/2003 | Khlif | |
| 9,105,282 | B1 | 8/2015 | Puttichaem et al. | |
| 2002/0179861 | A1 | 12/2002 | Khlif | |
| 2015/0362309 | A1 * | 12/2015 | Quaedackers | G01B 11/2441 702/166 |
| 2016/0027194 | A1 * | 1/2016 | Zuiderweg | G01B 11/2441 345/440 |

* cited by examiner

*Primary Examiner* — Shawn Decenzo
(74) *Attorney, Agent, or Firm* — Kagan Binder, PLLC

(57) ABSTRACT

Measuring surface features of a plurality of sliders including capturing an image of a surface of a slider bar using a large aperture interferometer, where the slider bar includes at least one slider of the plurality of sliders, and where the image includes surface height data for the slider bar surface and the included at least one slider. A bar height map is created of the slider bar based upon the surface height data of the captured image. Individual slider surfaces having individual slider height maps are identified, based at least in part of the number of sliders included on the slider bar.

20 Claims, 5 Drawing Sheets

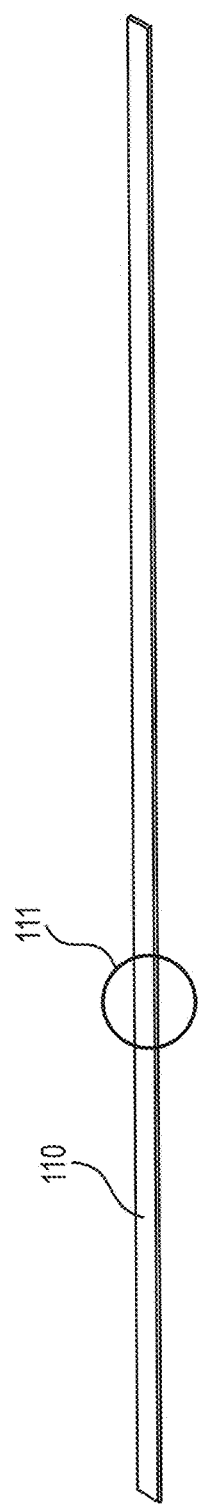
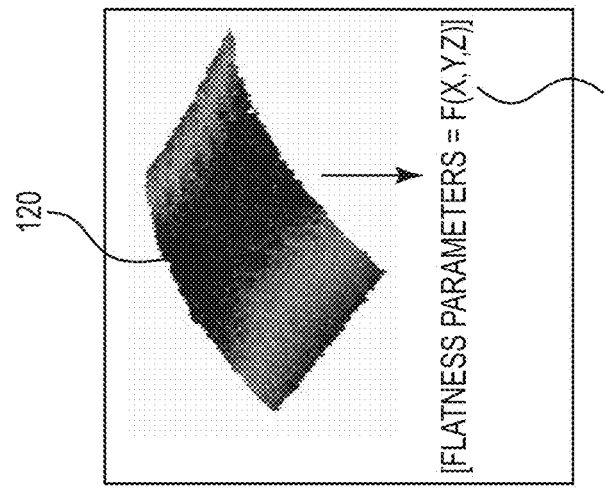
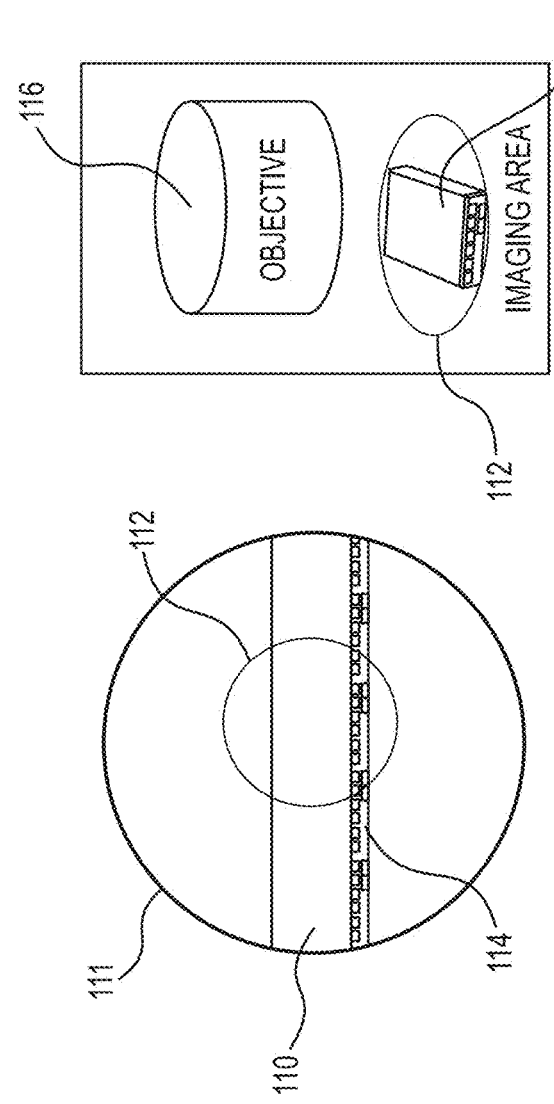
Fig. 1A (PRIOR ART)
Fig. 1B (PRIOR ART)
Fig. 1C (PRIOR ART)
Fig. 1D (PRIOR ART)

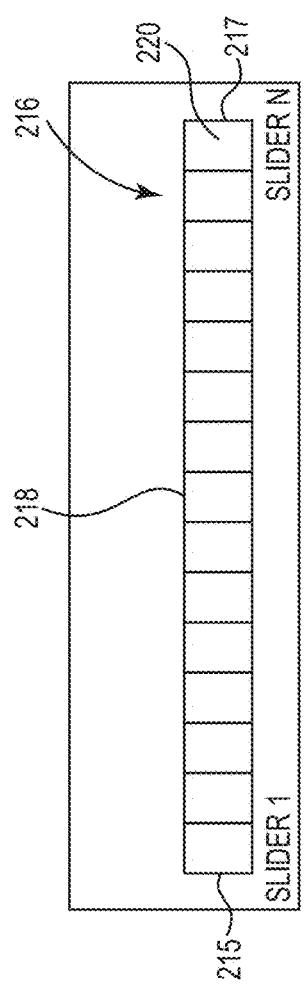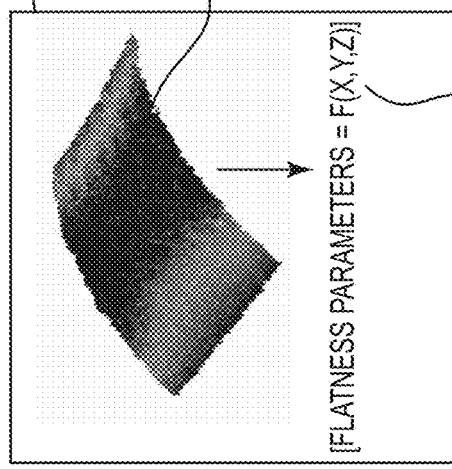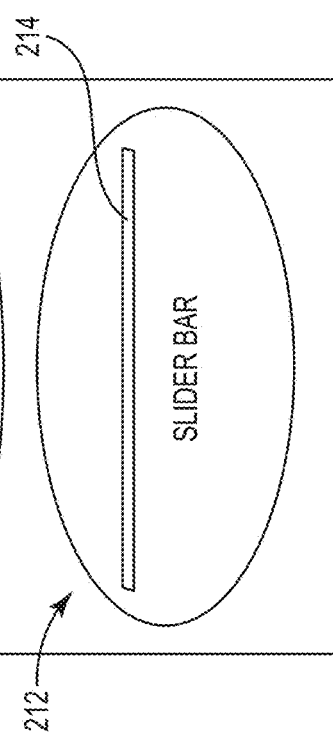

METHOD AND APPARATUS TO DETERMINE SLIDER-LEVEL FLATNESS AS PROVIDED ON A FULL CARRIER

PRIORITY CLAIM

This application claims priority to U.S. Provisional Patent Application having Ser. No. 62/193,438, filed on Jul. 16, 2015, which is incorporated herein by reference in its entirety.

BACKGROUND

Aspects of the present invention are directed to slider fabrication, and in particular to an improved manner of measuring flatness of a slider surface.

Sliders are fabricated for utilization within data storage disk drives (e.g., hard disk drives) for positioning a magnetic head including read/write elements relative to one or more spinning disks. Each slider typically includes read/write elements along with electrical contacts to facilitate electrical connection with an electronic data control system. Sliders are also provided with air bearing features that controllably affect the manner by which the slider "flies" at a fly height on an aerodynamic air bearing created by a spinning disk, forming a head-media separation distance between the slider and the disk. Specifically, the aerodynamic and topographical (height-related) properties of the slider and a slider surface thereof influence the fly height in addition to pitch, roll, head-media separation distance, and other important features of the data storage disk drive. The aforementioned features range in scale from nanometer to millimeter size.

The density of data tracks on disk surfaces has been increasing in order to obtain greater data storage within a given disk surface area. This surface storage density is commonly referred to as areal density. Specifically, the linear density of the data tracks themselves has increased and the data tracks have become narrower. The data tracks have become more tightly packed and the radial spacing between data tracks has decreased in order to increase areal density. In order to continue to improve the areal density and to improve read/write performance of the data storage disk drive, it is desirable to reduce the head-media separation distance between the read/write elements on the slider and the disk. A smaller head-media separation distance may increase the magnetic recording density at least in part by improving an associated signal-to-noise ratio and associated read/write precision of the magnetic head vis-à-vis the media (e.g., the disk). Typically, a head-media separation distance between the slider and a spinning disk is 10 nm or less.

An ideal slider for use in a hard disk drive would have flat and uniform surfaces, including the air bearing surface. However, a slider is generally not merely flat, but has a purposely-contoured air bearing surface in order to permit function of the air bearing, leading to a fly height, as discussed above. Flat surfaces would generally lead to more predictability and precision, especially on a very small, nanometer scale. In practice, however, sliders generally do not have desired, ideal, or uniform flatness (defined by flatness parameters), and may have surface feature imperfections for a variety of reasons. One way to increase performance and to reduce the head-media separation distance is to better flatten or reduce the roughness (and thus increasing the flatness) of certain of the slider surfaces, in particular an air bearing surface. The air bearing surface generally faces the media or disk over which the slider would eventually fly over during use. Better flattening and/or reduction in roughness of the slider surfaces may lead to more uniformly flattened or contoured slider surfaces, which may be desirable.

One method by which slider surfaces can be flattened and/or reduced in roughness is through lapping. Lapping, as used herein, is a machining process related to polishing by which two surfaces are rubbed together with an abrasive between them, whereby unwanted material is removed from an object, such as a slider, in order to give desired surface qualities, dimensions, and/or shape of the object, such as flatness. Lapping, also referred to as plate lapping, can operate on the nanometer scale, and can preferably have a high degree of precision for materials processing. Lapping, as used herein, may utilize a lapping plate, and both free abrasive lapping and fixed abrasive lapping are contemplated. A slider may have undesirable imperfections before lapping, but may also retain some degree of imperfection during, and after a lapping process.

Multiple sliders are often fabricated from a single wafer that is cut into slider bars. Slider bars may be held by bar carriers during lapping. The wafer may be formed of the materials and layers specified for a desired slider construction. The wafer may be composed of various materials, including ceramic materials and/or silicon. Examples include $Al_2O_3$, TiC, etc. From such a wafer, a portion of the wafer is separated from the remainder, the portion is typically rectangular and is dimensioned based upon a desired number of rows and number of sliders in each row. Known processes utilize a rectangular wafer portion that is appropriately sized to produce roughly 40 rows of sliders with each row providing about 60-75 sliders. The wafer portion is then diced into slider bars equal to the number of rows provided, creating an equal number of slider bars as there are initially rows.

After separation into the slider bars, it may be determined that a surface of at least one of the slider bars has imperfections. If at least some imperfections are found, such as surface roughness, the slider bars may benefit from flattening. The surface may then be lapped in order to increase surface flatness and to decrease surface roughness. An example slider bar may have dimensions of one slider length wide by 70 slider widths long. An example surface subject to a lapping step is a common air bearing surface of one or more slider bars. To assist lapping, carriers, such as slider bar carriers, can be configured to support each of the slider bars that have been separated from a wafer and to accurately hold each of the slider bars at a proper orientation for lapping. As above, a typical slider bar carrier may hold 40 slider bars each of a length of 70 sliders to make, for example, a total of 2800 sliders. The air bearing surface of each slider is preferably lapped to comply with desired slider surface characteristics, such as slider curvature metrics (degree of flatness) in terms of crown, cross, and/or twist curvature. A slider bar carrier, as used herein, may be a free-bar carrier or a production bar carrier.

A typical slider is roughly rectangular when viewed from an air bearing surface of the slider, the slider having a length and a width. As used herein, three types of across-slider curvature metrics are defined, as follows. Crown curvature is the curvature of a slider following the length (longitudinal axis) of a slider. Cross, camber, or cross-crown curvature is the curvature of a slider following the width (transverse axis) of a slider. Twist curvature is curvature where a slider has at least a degree of twist about its longitudinal or transverse axes, that is, where one end of a slider is not coplanar with another end of the same slider. While twist does not typically directly affect fly height, high twist curvature values, either positive or negative, can cause other negative tribological (i.e., interactive surfaces in relative motion) effects, such as increased wear due to changes in friction or lubrication, and/or induced roll.

After a lapping process or step is performed, individual sliders of the slider bars may be separated from one another, e.g., by dicing, for assembly and use in a storage disk drive head suspension assembly. However, slider surface flatness may preferably be verified prior to dicing the sliders to be sure that the air bearing surface of each slider is flattened to a desirable specification for usage. If the slider surface flatness is determined to be suboptimal, a further lapping step could be performed prior to dicing the sliders from the slider bars. It may be undesirable or inefficient to perform a lapping step on each slider individually.

Slider surfaces are typically inspected using optical metrology technology such as utilizing commercially-available interferometric systems. An interferometer is a known device that utilizes interferometry, where electromagnetic waves are superimposed in order to extract information about the waves. Interferometers are typically used to measure small displacements, refractive index changes, and surface irregularities. For the purposes of this disclosure, an interferometer may be used to measure surface irregularities of one or more sliders.

Various interferometer systems, such as small aperture interferometers, are commercially available from, for example, Bruker Corporation, Zygo, or Taylor-Hobson, specifically including a small aperture optical interferometers having approximately a 1-2 mm imaging area field-of-view (FOV) that is sized to image and model flatness of individual sliders. Small aperture interferometers would typically image an individual slider at a time while the sliders are still present in slider bar form.

Various slider fabrication process steps include a high level of complexity, low tolerances, and small size specifications. Typical process steps include fine line photolithography, reactive ion etching, ion milling, and/or thin film deposition. A lapping step, as stated, is often used to ensure that the surface roughness of the slider air bearing surface of is minimal. Materials used in the manufacturing of a slider vary depending on the desired properties. Typically, magnetic heads, which may include read/write elements, are constructed from a variety of materials, such as magnetic alloys, metal conductors, ceramic, and polymer insulators in a complex three-dimensional (3D) structure having precise tolerances.

SUMMARY

This disclosure describes methods and structures for an improved manner of measuring surface flatness of a slider surface. The methods and structures use a large aperture interferometer to capture a full slider bar carrier in one shot and segmenting a captured surface height data map into individual slider height maps in order to assess flatness of the individual slider surfaces, among other things.

The described measurement methods and systems allow for quick measurement and characterization of many thousands of sliders in one large aperture interferometer field-of-view prior to separating the individual sliders, by dicing them from slider bars, for assembly in a hard disk drive. The proposed measurement systems are optimized to acquire the image of a full slider bar carrier in one capture shot. The proposed methods aid in providing desired flatness parameters for thousands of sliders in a reduced amount of time.

The present disclosure is based upon methodology including optical metrology as described, above. It is a purpose of the present disclosure to increase flatness sampling and measurement to 100% of the sliders within a reduced time period. The present disclosure may enable an economically-viable means of attaining 100% sampling of production flatness and allow for determining slider bar surface and profile information in terms of a slider height map.

Large aperture interferometers and hardware having sufficiently high pixel density allowing for bar identification and slider segmentation are commercially available. By utilizing pattern recognition image segmentation methods, individual slider surfaces are identified and converted into respective bar height maps. The time required to capture an image may be similar to the time presently required to capture an image of each individual slider. Processing time to conduct the slider bar identification and slider segmentation analysis would be greater in processing a bar or slider bar carrier, but compared with the imaging and analysis of individual sliders, the analysis of the present disclosure saves time. Disclosed methods and systems may be around 50 times faster than the existing methods and systems for individual slider surface height measurement.

A first embodiment is directed to a method of measuring surface features of a plurality of sliders. The method includes capturing an image of a surface of a slider bar using a large aperture interferometer, where the slider bar includes at least one slider of the plurality of sliders, where the image includes surface height data for the slider bar surface and the included at least one slider. The method also includes creating a bar height map of the slider bar based upon the surface height data of the captured image. The method also includes identifying individual slider surfaces having individual slider height maps, based at least in part of the number of sliders included on the slider bar.

Variations of the first embodiment are also contemplated. According to one embodiment, the method also includes flattening the individual sliders using a lapping process, in response to the segmenting the bar height map into the plurality of individual slider heights maps. According to another embodiment, the capturing the image is in response to a lapping process of the slider surface. According to another embodiment, the surface features of the slider include surface flatness. According to another embodiment, the captured image is of at least two connected slider bars prior to a separation of the slider bars. According to another embodiment, the large aperture interferometer has an imaging area of at least 50 mm. According to another embodiment, the identifying the individual slider surfaces uses pattern recognition.

A second embodiment is directed to a system for measuring surface features of a plurality of sliders. The system includes a wafer including one or more non-diced sliders, the one or more sliders arranged in slider bars and each having a slider surface. The system also includes a large aperture interferometer. The system also includes a controller in communication with the large aperture interferometer. According to the second embodiment, the controller is configured to cause the large aperture interferometer to capture an image of a surface of the wafer including the respective slider surfaces. According to the second embodiment, the controller is also configured to create a bar height map of the slider bar based upon the surface height data of the captured image. According to the second embodiment, the controller is also configured to identify individual slider surfaces having individual slider height maps, based at least in part on the number of sliders included on the slider bar.

According to the second embodiment, the controller is also configured to segment the bar height map into the plurality of individual slider height maps.

Variations of the second embodiment are also contemplated. According to one embodiment, the controller is further configured to flatten the individual sliders using a lapping process, in response to the segment the bar height map into the plurality of individual slider height maps. According to another embodiment, the surface features of the slider include surface flatness. According to another embodiment, the captured image is of at least two connected slider bars prior to a separation of the slider bars. According to another embodiment, the capturing the image of the surface of the slider bar includes using a high pixel density camera of sufficient resolution to provide surface height data for each individual slider. According to another embodiment, the large aperture interferometer has an imaging area of at least 50 mm. According to another embodiment, wherein the controller is configured to use pattern recognition to identify the individual slider surfaces.

A third embodiment is directed to a second method of measuring surface features of a plurality of sliders. The method includes capturing an image of a surface of a first slider bar and a second slider bar using a large aperture interferometer, where the first and second slider bars each include at least one slider of the plurality of sliders, and where the image includes surface height data for a surface of the first and second slider bars and the included at least one slider. The method also includes creating a bar height map of the first and second slider bars based upon the surface height data of the captured image. The method also includes identifying individual slider surfaces having individual slider height maps, based at least in part on the number of sliders included on the first and second slider bar. The method also includes segmenting the bar height map into the plurality of individual slider height maps.

Variations of the third embodiment are also contemplated. According to one embodiment the method also includes flattening the individual sliders using a lapping process, in response to the segmenting the bar height map into the plurality of individual slider height maps. According to another embodiment, the capturing the image of the surface of the first and second slider bars includes using a high pixel density camera of sufficient resolution to provide surface height data for each of the plurality of sliders. According to another embodiment, the large aperture interferometer has an imaging area of at least 50 mm. According to another embodiment, the identifying the individual slider surfaces uses pattern recognition.

These and various other features and advantages will be apparent from a reading of the following detailed description.

BRIEF DESCRIPTION OF THE DRAWINGS

The invention may be more completely understood in consideration of the following detailed description of various embodiments of the invention in connection with the accompanying drawing, in which:

FIG. 1A-1D illustrate an example conventional slider bar measurement method.

FIGS. 2A-2C illustrate steps in an improved method by which a plurality of sliders can be analyzed for flatness simultaneously, according to various embodiments.

DETAILED DESCRIPTION

Figure 3:
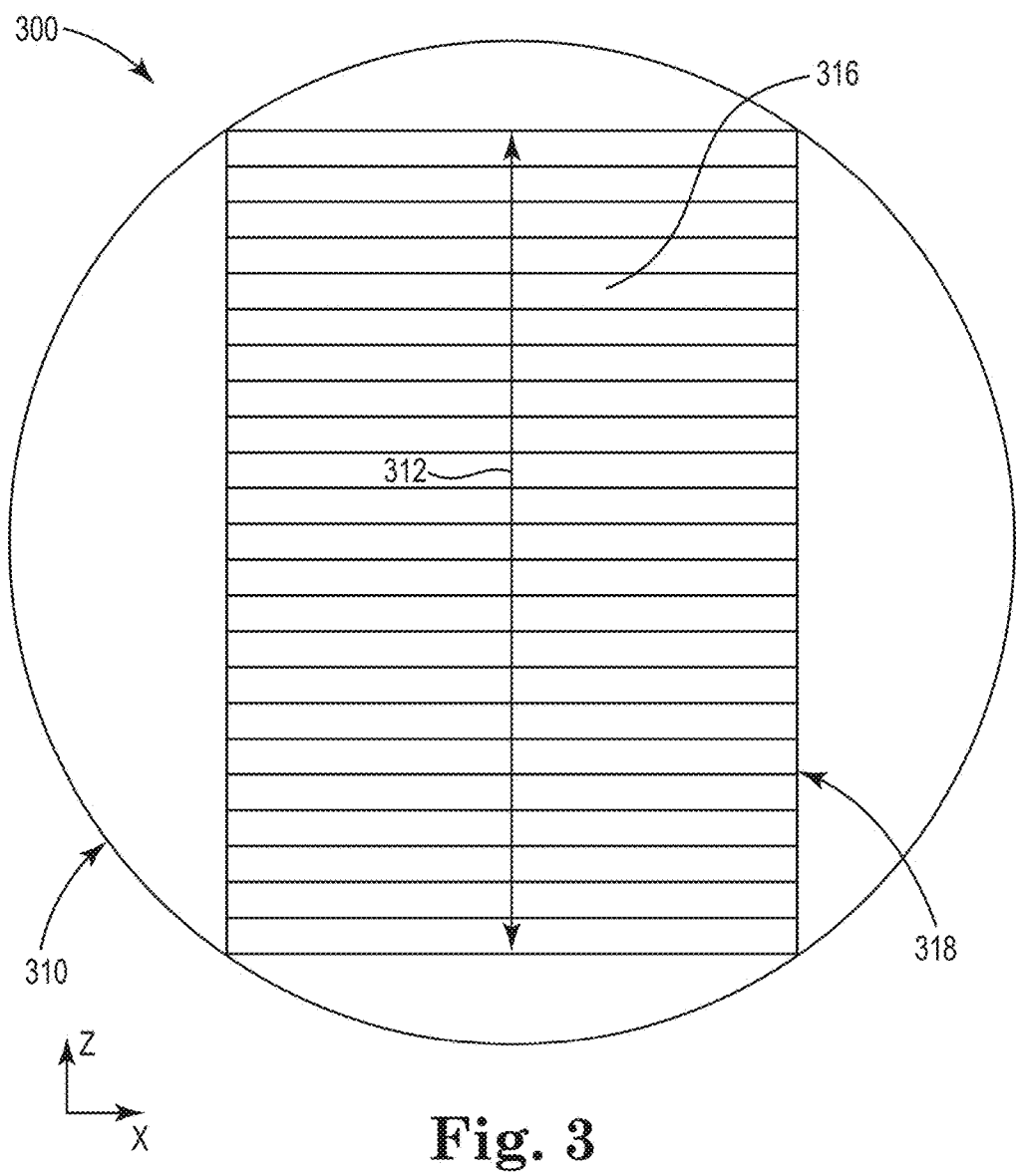
FIG. 3 schematically illustrates a view of a plurality of slider bars that are positioned in an imaging area of a large aperture interferometer of the present disclosure, according to various embodiments.

Aspects of the present invention are directed to slider fabrication, and in particular to an improved manner of measuring surface flatness of one or more sliders for use in a storage disk drive.

FIG. 1A-1D illustrate an example conventional slider bar measurement method.

FIG. 1A depicts a first step of a conventional method for sequentially measuring multiple sliders included in a slider bar 110.

An existing process begins with a wafer (not shown) that will eventually become a plurality of sliders. A wafer is first separated into one or more slider bars 110. The wafer and/or slider bar 110 can be optionally lapped at various times. The slider bar 110 is composed of a plurality of connected (e.g., unseparated or non-diced) sliders and components thereof. A slider bar 110 typically includes about 60-75 connected sliders. As stated, the slider bar 110 and sliders thereon may have been lapped prior to this step. Slider bar 110 may have dimensions equivalent to a height of a slider, by a width of multiple sliders, forming a roughly one-dimensional slider bar 110. A highlighted slider section 111 is centered on several non-diced sliders on the slider bar 110, and will be described in greater detail, with reference to FIG. 1B.

FIG. 1B shows an enlarged view of slider section 111 of the slider bar 110 of FIG. 1A in greater detail.

Individual slider features 114 can be seen in slider section 111 of slider bar 110, including electrical contacts along with read/write elements even as the sliders are not yet diced from one another. An imaging area 112 shows an approximate location of a non-diced slider on slider bar 110. Imaging area 112 indicates a typical field-of-view (FOV) or imaging area for an example existing imaging device configured to analyze imaging area 112. Imaging area 112 and imaging device, e.g., a small aperture interferometer having an FOV of roughly 1-2 mm, typically has a FOV sufficient to analyze one typical slider. The imaging area 112 generally corresponds to an air bearing surface area of one of the sliders of the slider bar 110. Corresponding lateral resolution and pixel size of the small aperture interferometer imaging device used to analyze a slider within imaging area 112 is typically in the range of 2-3 µm.

FIG. 1C illustrates an imaging device objective 116 located above a single slider 118 within imaging area 112.

An objective 116 of an example imaging device (e.g., a small aperture interferometer) may have an imaging area FOV of imaging area 112 of a single slider 118 on the slider bar 110, with the objective 116 located above and configured to look down upon and image the slider 118. The objective 116 of the imaging device is shown positioned to capture an area measurement zone of the slider 118, for analysis. Using the objective 116, the imaging device may measure and analyze the surface flatness of the slider 118, including area, topography, and/or other characteristics of slider 118, e.g., using surface metrology. The imaging device forms an electronic image or map of a surface metrology of the slider 118, which includes topographical and surface characteristic data of the slider 118.

FIG. 1D is a three-dimensional graphical representation of measured flatness parameters of a slider after the surface of the slider has been measured.

After the electronic image of the slider 118 is captured, as shown in FIG. 1C, the surface flatness is analyzed using various applicable methods. Using a commercially-available imaging device (e.g., small aperture interferometer), each slider, (including slider 118) is measured in turn across the slider bar 110 and modeled for slider flatness parameters of interest, as a function of three axial dimensions, x, y, and z, F(x,y,z). Sliders are measured sequentially across the slider bar 110 for each of the (roughly 70) sliders. Each slider measurement presently takes several (e.g., five) seconds. To measure a full slider bar 110 thus generally takes several minutes. Only one slider 118 at a single location (imaging area 112) at a time is measured on the slider bar 110 using the shown method.

The analysis of the surface flatness of the slider 118 preferably provides a height map image 120 (e.g., surface map) that indicates flatness parameters 122, as a function of x, y, and z dimensions, F(x,y,z). The height map image 120 is shown as a three-dimensional computer-generated image, having colors or grayscale shading indicating surface height data (y-axis data) over a plane formed by an x-axis and a z-axis. The x, y, and z dimension data may then be modeled or fit to various slider curvature metrics (degrees of flatness), e.g., crown, cross, and/or twist curvature.

If any of the one or more sliders (e.g., slider 118) is not sufficiently flat in the y-axis dimension in terms of the x, and z dimensions, the slider bar 110 could be lapped again before dicing, or the slider 118 or slider bar 110 could be rejected.

As stated, using current systems and techniques described above, imaging and analysis of a single slider (e.g., slider 118) takes about five seconds per measurement. Thus, to measure flatness of each slider of a slider bar 110 takes approximately six minutes (five seconds multiplied by 70 sliders on a slider bar 110). As outlined in the background, above, a typical slider bar carrier supports 40 slider bars (e.g., slider bar 110). Even assuming an ideal 100% sampling efficiency (e.g., no errors or problems interpreting surface flatness or metrology data), it would then take approximately four hours to take flatness measurements for each slider of one 40 slider bar carrier (six minutes times 40 slider bars 110 equals approximately four hours).

A large number of complex systems are generally required if full (100%) sampling is utilized for slider production. Such systems not only require capital expense, but also large amounts of floor space, along with related maintenance and engineering support. Such systems also may require tool-matching procedures and calibrations to reduce yield errors from matching offsets. If only limited sampling is conducted in order to save of equipment and space, overall slider bar 110 profile information generally cannot be gathered, and the manufacturing line is at a higher risk of flatness excursions or imperfections.

FIGS. 2A-2C illustrate steps in an improved method by which a plurality of sliders can be analyzed for flatness simultaneously.

FIG. 2A shows an arrangement where a large aperture interferometer 210 is located above a plurality of slider bars, including slider bar 214, according to various embodiments.

Existing surface metrology systems in use for sliders (e.g., FIGS. 1A-1D) would take many hours to measure a single slider bar carrier full of slider bars. In contrast to FIGS. 1A-1D, where each slider requires individual time-consuming measurement, FIG. 2A depicts a first step in process where multiple sliders can be measured for surface flatness and surface height data at the same time using a large aperture interferometer 210 capable of capturing an entire slider bar carrier (not shown, see 410 of FIGS. 4 and 5) of non-diced sliders in sufficient detail to allow for segmentation of captured interferometric data into three-dimensional individual slider height maps derived from the surface height data.

A large aperture interferometer 210 (in contrast to the small aperture interferometer and objective 116 discussed with respect to FIGS. 1A-1D) can be configured to capture a FOV having a circular, ellipsoid, or other shaped imaging area 212, as illustrated, that is large enough to capture the length of at least one slider bar 214 (having approximately 70 sliders). An imaging area 212 of the large aperture interferometer 210 may also be large enough to capture multiple bar widths simultaneously. Preferably, the imaging area 212 of the large interferometer 210 is large enough to capture a single, high-resolution, and high-precision interferometric image of an entire slider bar carrier (not shown, see 410 of FIGS. 4 and 5) supporting, for example, 40 slider bars (including slider bar 214).

Interferometers, as used herein, may come in small aperture type or large aperture type. A small aperture type interferometer has a FOV imaging area 112 of about 1-2 mm. A large aperture type interferometer, in contrast, has a FOV imaging area 212 of about 50-80 mm, which is enough FOV to observe an entire slider bar carrier or wafer for the production of one or more sliders. An example large aperture interferometer 210 is the AccuFiz® interferometer, which is commercially available from the 4D Technology Corporation of Tucson, Ariz.

Preferably, the large aperture interferometer 210 has a FOV with an imaging area 212 of about 80 mm at high resolution, allowing capture of an entire slider bar carrier, as presently contemplated. As an example, with 70 sliders per slider bar 214 and 40 slider bars 214 per slider bar carrier, the large interferometer 210 can measure 2800 sliders at the same time by capturing a sufficiently high-resolution image of the entire slider bar carrier within imaging area 212. A high-precision interferometer (e.g., interferometer 210) having a pixel density of less than 25 μm per pixel, may be preferably employed in order to obtain a desired resolution and/or precision for the purposes of this disclosure. The imaging area 212 may be circular, but may be shown in a slanted perspective. A slider bar 214 may also be a slider lapping bar, according to various embodiments.

The large aperture interferometer 210 may preferably have a sensor device, such as a camera or objective that is capable of capturing a sufficiently high-resolution image, as an aspect of this disclosure. High-resolution, for the purposes of this disclosure, may be defined as a characteristic of a sensor device capable of detecting six million discrete pixels or more, according to various embodiments. However, the resolution should preferably be high enough to allow for sufficient data to be obtained for each individual slider surface, irrespective of a total number of pixels. Equipped with a high-resolution sensor device, a large-aperture interferometer can capture an image of a fully-loaded slider carrier, as would advance from a lapping apparatus. Preferably, a minimum of about 20 pixels of image data may ideally be obtained in the x and y directions to develop a digitized slider height map in terms of the x and y directions, as discussed further, below. More preferably, a resolution allowing for 40 or more pixels in the width (transverse) direction as shown in FIG. 2C can be obtained along with 100 or more pixels in the length (longitudinal) direction of a slider 220 (see FIG. 2B, 2C). As above, with a sufficient resolution and thus sufficient data points per slider, slider curvature metrics (e.g., degrees of flatness) including crown, cross, and/or twist curvature can be modeled and determined through various techniques and methods. With a high-resolution interferometer, such as large aperture interferometer 210, an increased resolution may permit reduced sensitivity to vibrations and other factors that affect precision and accuracy.

An example operation and methodology for determining individual slider 220 surface flatness may begin by placing a slider bar carrier within a FOV imaging area 212 of a large aperture interferometer 210, according to various embodiments. A high-resolution interferometric image may then be captured using the large interferometer 210, preferably of the entire imaging area 212, including many or all of the slider bars (e.g., slider bar 214) of the slider bar carrier in various known arrangements. As shown, a large aperture interferometer 210 is looking down at slider components being analyzed, including a representative single slider bar 214 (which may not be drawn to scale). However, in practice there could be many (e.g., 40) slider bars 214 measured in one capture shot. As a result, thousands of sliders (e.g., slider 220) may be measured by the large interferometer 210 and a system or controller connected thereto at one time. Preferably, all of the slider bars 214 would be captured by the large interferometer 210 imaging area 212 in one capture shot, leading to increased efficiency in surface metrology.

A controller (not shown) may be in communication with the large aperture interferometer 210, according to various embodiments and may be configured to control interferometric activities. The controller may also facilitate implementation and performance of various other methods, as described herein. The controller may include various computing components, including a central processing unit, memory, storage components, and be include an operating system and/or firmware installed thereon. The various components of the controller may be operatively or electrically connected to one another, and input/output device may be configured to interface with the controller.

FIG. 2B shows a bar height map 216 for a single slider bar 214. that has been segmented into a plurality of slider height maps 221 of equally-sized sliders 220.

Pattern-recognition techniques may be used to identify and analyze the bar 214 within the imaging area 212. A bar profile including a (digitized) surface bar height map 216 for each slider bar 214 may then be preferably created using an applicable calculation method based on the high-resolution interferometric image captured in FIG. 2A. The bar height map 216 may contain surface height data in three-dimensions, including x-, y- and z-axis data and/or dimensions of the bar 214. One (or more) full, common slider bar 214 surface is represented within the map as opposed to a single slider surface (in contrast to FIGS. 1A-1D). The bar height map 216 may advantageously represent relevant bar interferometric profile information for a plurality of individual sliders, including variations in height, curvature, flatness, imperfections, and other variations. The bar height map 216 may represent the relevant bar interferometric profile information through the use of visuals, such as color gradient, grayscale, or alternatively, a computer-readable digital format. According to one embodiment, a color gradient is used to represent variations in height of the bar height map 216, and a user may view the color to quickly assess the relative topography of a slider bar 214. If a color gradient is used, lower wavelength color, such as violet, may represent a higher point (relative height), and a lower wavelength color, such as red, may represent a lower point of a surface of a slider or slider bar 316. If a grayscale is used, a lighter color may represent a lower point, and a darker color may represent a higher point, according to one embodiment.

The bar height map 216 represents a plurality of individual slider height maps 221 (shown in FIG. 2C), but may not be drawn to scale, as shown. The bar height map 216 with regard to each individual slider height map 221 contained thereon may have respective individual slider data, color, and/or curvature. The bar height map 216, as shown, has a first end 215, a second end 217, and a middle point 218. Each of the first end 215, second end 217, and middle point 218 may represent one or more individual slider height maps 221 or slider data, as discussed herein. The first end 215 may represent a first slider, and the second end 217 may represent a last or $n^{th}$ slider 220.

The created (digitized) bar height map 216 of the bar 214 (or bars if more than one bar is present and being analyzed) may then identify individual sliders 220 having individual slider surfaces (see FIG. 2C) along the bar height map 216. Following the creation of a bar height map 216 in FIG. 2B, a method may segment the multiple-slider bar height map 216 into individual slider height maps 221 (see FIG. 2C), with each individual slider height map 221 including slider 220 data in three-dimensions, including x-, y- and z-axis data and/or dimensions. The segmentation of the method may begin with a slider 220 at the first end 215, and may continue segmenting sliders 220 at the middle point 218, and may continue segmenting until an $n^{th}$ slider is segmented on the second end 217.

Various pattern recognition techniques or methods may be employed to identify individual sliders 220 from one another, within the bar height map 216. An example method may utilize pattern recognition based on visible or identifiable slider components and/or characteristics (e.g., magnetic read/write head components, exposed bonding pads, electronic lapping guides, surface features, etc.). Alternatively, a different method may simply identify or receive total dimensions of the bar 214 and the number and/or width of sliders 220 contained within, and divide or segment the bar height map 216 into the applicable number of slider height maps 221, based upon the total number of sliders 220, defining the location and dimensions of each slider 220 within bar height map 216. Pattern recognition techniques and methods, as contemplated, may also employ heuristic or learning approaches, in order to increase efficiency and accuracy of identification of various sliders 220 from one another, according to various embodiments.

FIG. 2C illustrates a three-dimensional slider height map 221 of a single slider 220 following segmentation from bar height map 216.

A slider height map 221 of an individual slider 220 may be produced including surface height data, and may be modeled and defined in terms of flatness parameters $F(x,y,z)$ 222. According to other embodiments, multiple slider height maps 221 may be produced from multiple respective individual sliders 220. Various desired or ideal slider flatness parameters may be received and may also be represented as a function in terms of dimensions in the x-, y-, and z-axis, $F'(x,y,z)$. A method may then compare and contrast functions $F(x,y,z)$ and $F'(x,y,z)$ in order to determine if a lapping or subsequent lapping step is desired. Whether a lapping step is desired may be determined based on a flatness threshold, and whether the flatness threshold is met before or after a lapping step. A flatness threshold may be set at a level of total permissible imperfections on an individual slider height map 221, or a bar height map 216, according to various embodiments.

Following division of the (digitized) bar height map 216 into individual sliders 220, a slider height map 221 is then preferably created for each individual slider 220. This slider height map 221 is preferably similar to that discussed above and shown in FIG. 1D, as such slider height map 221 was created for a slider 220 surface from an individual slider image surface capture.

FIG. 3 schematically illustrates a view 300 of a plurality of slider bars 316 that are positioned in an imaging area 310 of a large aperture interferometer of the present disclosure.

A FOV of an imaging area 310 of an example large aperture interferometer (e.g., interferometer 210 of FIG. 2A) is shown positioned over a plurality of slider bars 316 (which may be held or supported by a slider bar carrier, according to various embodiments). The plurality of separated slider bars 316 that are oriented horizontally across the view 300, as shown. Slider bars 316 may not reach the edges of the imaging area 310, as the slider bars 316 are stacked vertically along vertical (z-) axis 312, forming a rectangular grouping 318 of slider bars 316. Alternatively, the imaging area 310 may be positioned over the rectangular grouping 318 of slider bars, such as may be supported by a slider bar carrier (e.g., slider bar carrier 410 of FIGS. 4 and 5). The rectangular grouping 318 may be supported by a partially or fully-loaded slider bar carrier. The slider bars 316 are shown as vertically separated along vertical axis 312 of imaging area 310, and slider bars 316 are aligned vert-ically along slider bar vertical axis 312.

Slider bars 316 may each include surface or visual markings or other height map representation (which may be similar to bar height map 216 of FIG. 2). The various height maps may be represented as a color gradient, grayscale, or a computer-readable format. Across slider bar 316, a bar height map 216 may be generated with colors indicating surface height data (y-axis data) in terms of a plane (formed by the x- and z-axis) of each slider bar 316. In the case of a color gradient example, a lower wavelength color, such as violet, may represent a higher point, and a lower wavelength color, such as red, may represent a lower point of a surface of a slider or slider bar 316. Alternatively, a grayscale or computer-readable format may be utilized, as described herein.

Specifically, the bar height map 216 may represent a captured interferometric flatness image of the wafer 314 (within a loaded slider bar carrier) with flatness or y-axis surface height data. According to an image map of the rectangular grouping 318 of the slider bars 316, the slider bar 316 rows are identifiable along vertical axis 312 of the view 300. Slider bars 316 can vary in height relative to one another for various reasons beyond the scope of this disclosure. A height map covering the entire surface of the rectangular grouping 318 may be electronically segmented into slider bar 316 "ribbons" with height maps that corresponding to the flatness of each slider bar 316. Each ribbon may correspond to a height map 216 shown in FIG. 2B. As discussed herein, by segmenting the surface height data of the entire view 300 and imaging area 310, individual slider bar height maps (e.g., bar height maps 216) can be obtained that contain flatness height maps for each and every individual slider.

Figure 4:
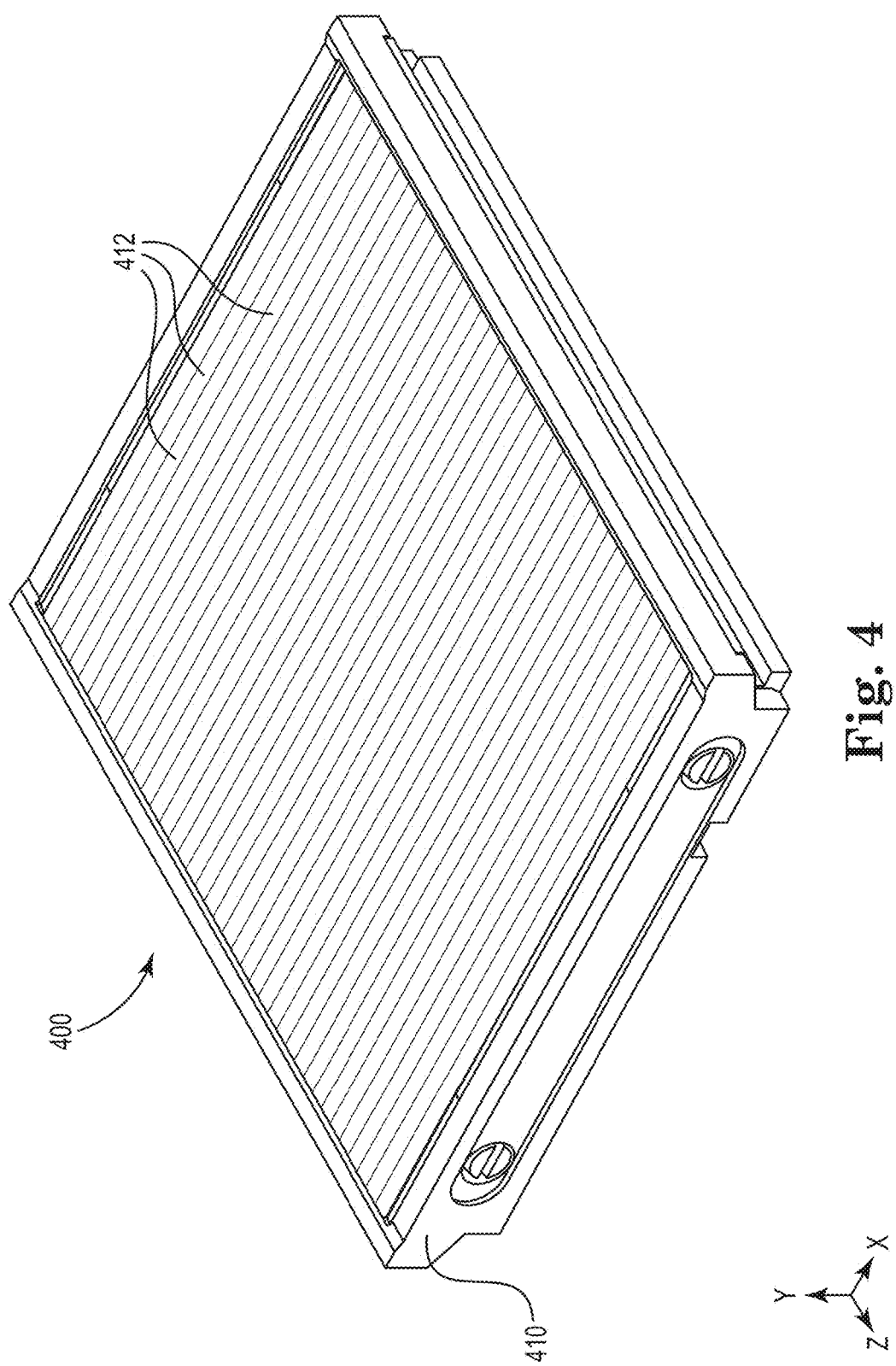
FIG. 4 depicts a perspective view of an example slider bar carrier having a plurality of slider bars thereon, according to various embodiments.

FIG. 4 depicts a perspective view 400 of an example slider bar carrier 410 having a plurality of slider bars 412 thereon.

Following removal of slider bars 412 from a slider wafer (not shown), the slider bars 412 can be received by a slider bar carrier 410. A slider bar carrier 410 is shown fully loaded with slider bars 412, with each of the individual slider bars 412 supported for a lapping operation to occur on a common surface (e.g., an eventual air bearing surface, shown facing up) of each slider bar 412. The common surface is the visible surface of the slider bar carrier 410 from the shown perspective view 400. A fully loaded slider bar carrier 410 may hold about 40 slider bars 412 arranged adjacent to one another (as shown, along the x-axis). The slider bar carrier 410 may also be partially loaded, according to other embodiments.

Figure 5:
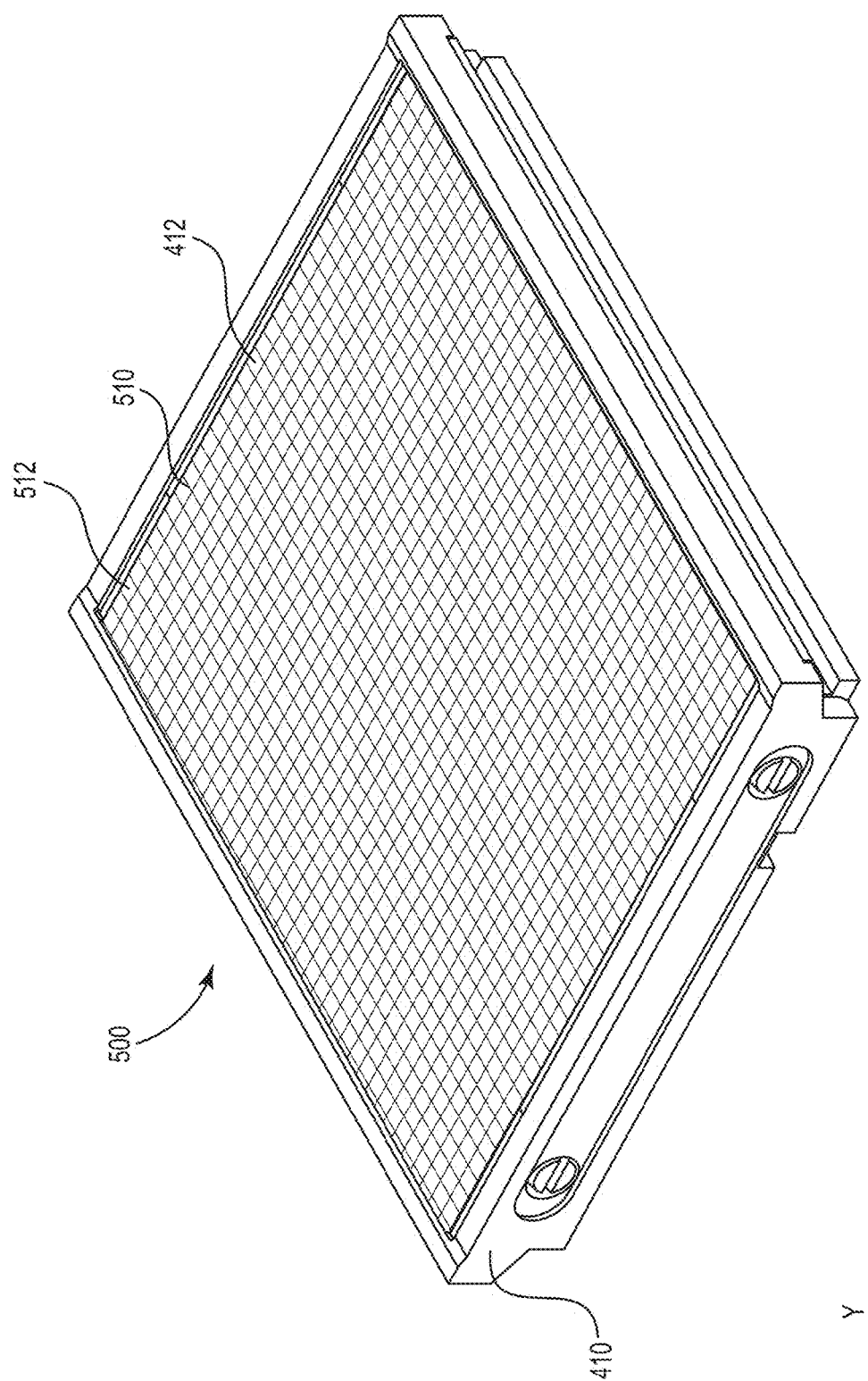
FIG. 5 illustrates the slider bar carrier of FIG. 4 loaded with slider bars, showing a pattern applied to each slider bar as to how each slider bar is to subsequently be diced into individual sliders, according to various embodiments.

FIG. 5 illustrates the slider bar carrier 410 of FIG. 4 loaded with slider bars 412, but also shows a pattern applied to each slider bar 412 as to how each slider bar 412 is to subsequently be diced into individual sliders.

The slider bar carrier 410 discussed in FIG. 4 may support about 40 slider bars 412 if fully loaded, as shown. Each slider bar 412 may be composed of materials and components of approximately 60-75 non-diced sliders 512, to be patterned along pattern lines 510 along the z-axis. For example, a loaded slider bar carrier 410 may have the dimensions of 53 mm (x-axis) by 60 mm (z-axis), and may be configured to produce a total of thousands of one size slider 512 when the slider bars 412 are separated from one another. Upon removal from slider bar carrier 410, each slider bar 412 is diced along the plurality of patterning lines 510. Slider bar carrier 410 may include vertical slider slots that assist in dicing the sliders 512 from each slider bars 412.

A large aperture interferometer as described herein (e.g., interferometer 210 of FIG. 2A) is preferably capable of capturing such an interferometric image of the entire surface of the slider bar carrier 410, along with flatness data of each non-diced slider 512, whether before, after, or during a lapping process.

In the detailed description, reference is made to the accompanying drawing that forms a part hereof and in which are shown by way of illustration at least one specific embodiment. The detailed description provides additional specific embodiments. It is to be understood that other embodiments are contemplated and may be made without departing from the scope or spirit of the present invention. The detailed description, therefore, is not to be taken in a limiting sense. While the present invention is not so limited, an appreciation of various aspects of the invention will be gained through a discussion of the examples provided.

It is understood that numerous variations of methods of determining slider-level flatness could be made while maintaining the overall inventive design of various components thereof and remaining within the scope of the disclosure. Numerous alternate design or element features have been mentioned above.

As used herein, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

Thus, embodiments of the methods of determining slider-level flatness are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

The invention claimed is:

1. A method of measuring surface features of a plurality of sliders, comprising:
   capturing an image of a surface of a slider bar in one capture shot using a large aperture interferometer, wherein the slider bar includes at least two connected sliders of the plurality of sliders, and wherein the image includes surface height data for the slider bar surface and the included at least two connected sliders;
   creating a bar height map of the slider bar based upon the surface height data of the captured image;
   identifying individual slider surfaces having individual slider height maps, based at least in part on the number of connected sliders included on the slider bar; and
   segmenting the bar height map into a plurality of individual slider height maps.

2. The method of claim 1, further comprising:
   flattening the plurality of connected sliders using a lapping process, in response to the segmenting the bar height map into the plurality of individual slider height maps.

3. The method of claim 1, wherein the capturing the image is in response to a lapping process of the slider surface.

4. The method of claim 1, wherein measured surface features of the plurality of sliders include surface flatness.

5. The method of claim 1, wherein the captured image is of at least two connected slider bars prior to a separation of the slider bars.

6. The method of claim 1, wherein the capturing the image of the surface of the slider bar in the one capture shot includes using a high pixel density camera of sufficient resolution to provide surface height data for each individual slider of the slider bar in the one capture shot.

7. The method of claim 1, wherein the large aperture interferometer has an imaging area having a largest dimension of at least 50 mm.

8. The method of claim 1, wherein the identifying the individual slider surfaces uses pattern recognition.

9. A system for measuring surface features of a plurality of connected sliders as the sliders are arranged in a slider bar, the system comprising:
   a large aperture interferometer sized and configured to capture an image of the slider bar using a high pixel density camera of sufficient resolution to provide surface height data for the plurality of connected sliders of the slider bar in one capture shot, wherein the captured image includes surface height data for at least two connected sliders of the plurality of connected sliders; and
   a controller in communication with the large aperture interferometer, the controller configured to:
   cause the large aperture interferometer to selectively capture in one capture shot an image of a surface of the slider bar, the captured image including surface height data,
   create a bar height map of the slider bar based upon the surface height data of the captured image,
   identify individual slider surfaces having individual slider height maps, based at least in part on the number of connected sliders included on the slider bar, and
   segment the bar height map into a plurality of individual slider height maps.

10. The system of claim 9, wherein the controller is further configured to:
    flatten the plurality of connected sliders using a lapping process, in response to the segmenting the bar height map into a plurality of individual slider height maps.

11. The system of claim 9, wherein measured surface features of the plurality of sliders include surface flatness.

12. The system of claim 9, wherein the captured image is of at least two connected slider bars prior to a separation of the slider bars.

13. The system of claim 9, wherein the large aperture interferometer has an imaging area having a largest dimension of at least 50 mm.

14. The system of claim 9, wherein the controller is configured to use pattern recognition to identify the individual slider surfaces.

15. A method of measuring surface features of a plurality of sliders, comprising:
    capturing an image of a surface of a first slider bar and a second slider bar in one capture shot using a large aperture interferometer, wherein the first and second slider bars each include at least two connected sliders of the plurality of sliders, and wherein the image includes surface height data for a surface of the first and second slider bars and the included at the least two sliders of each of the first and second slider bars;
    creating a bar height map of the first and second slider bars based upon the surface height data of the captured image;
    identifying individual slider surfaces having individual slider height maps, based at least in part on the number of connected sliders included on the first and second slider bars; and
    segmenting the bar height map into a plurality of individual slider height maps.

16. The method of claim 15, further comprising:
    flattening the plurality of connected sliders using a lapping process, in response to the segmenting the bar height map into a plurality of individual slider height maps.

17. The method of claim 15, wherein the capturing the image of the surface of the first and second slider bars in the one capture shot includes using a high pixel density camera of sufficient resolution to provide surface height data for each of the plurality of sliders in the one capture shot.

18. The method of claim 15, wherein the large aperture interferometer has an imaging area having a largest dimension of at least 50 mm.

19. The method of claim 15, wherein the identifying the individual slider surfaces uses pattern recognition.

20. The method of claim 15, wherein measured surface features of the plurality of slider include surface flatness.

* * * * *